United States Patent
Yee et al.

(10) Patent No.: US 7,932,113 B1
(45) Date of Patent: Apr. 26, 2011

(54) METHOD OF FABRICATING ORGANIC LIGHT EMITTING DIODE DISPLAY

(75) Inventors: Moonky Yee, Goyang-si (KR); Changwook Han, Seoul (KR); Woochan Kim, Suwon-si (KR); Yuri Koh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/907,689

(22) Filed: Oct. 19, 2010

(30) Foreign Application Priority Data

Nov. 6, 2009 (KR) .......................... 10-2009-0107018

(51) Int. Cl.
*H01L 51/00* (2006.01)
(52) U.S. Cl. .................. 438/35; 257/E51.022; 313/504
(58) Field of Classification Search ............... 257/40, 257/E51.022; 313/504; 427/68; 438/35, 438/763
See application file for complete search history.

(56) References Cited

U.S. PATENT DOCUMENTS 7,275,972 B2 * 10/2007 Wolk et al. ..................... 445/24
7,825,584 B2 * 11/2010 Kim .............................. 313/504
* cited by examiner

*Primary Examiner* — Matthew S Smith
*Assistant Examiner* — Daniel Shook
(74) *Attorney, Agent, or Firm* — McKenna Long & Aldridge LLP

(57) ABSTRACT

A method of fabricating an OLED display, includes sequentially forming a TFT array, first electrodes, and a first related layer on a first substrate, respectively forming heat-generating elements on second and third substrates, forming a red organic emission pattern on the second substrate, and forming a green organic emission pattern on the third substrate, aligning and attaching the first and second substrates, applying a voltage to heat-generating elements to transfer the red organic emission pattern to red pixel regions, thereby forming red organic emission layers, aligning and attaching the first and third substrates, applying a voltage to the heat-generating elements to transfer the green organic emission pattern to green pixel regions, thereby forming green organic emission layers, entirely depositing a blue organic emission material on the first substrate, thereby forming a blue organic emission layer, and sequentially forming a second related layer and a second electrode on the first substrate.

9 Claims, 9 Drawing Sheets

200(200') 202(202')

203R 200  202

203G

200'  202'

FIG. 7C
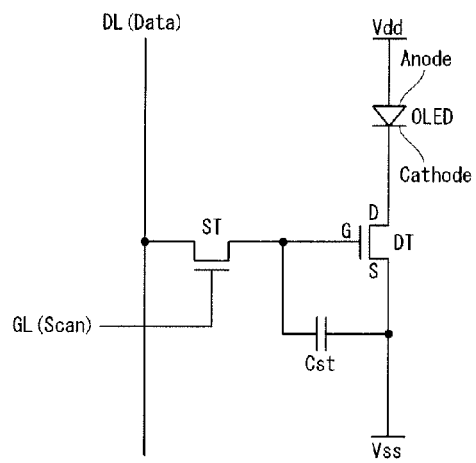
FIG. 8
| OLED | Volt(V) | Cd/A | Cd/m2 |
|---|---|---|---|
| G EMISSION LAYER | 3.20 | 25.99 | 2599 |
| G EMISSION LAYER + B EMISSION LAYER | 4.23 | 29.52 | 2951 |
FIG. 9
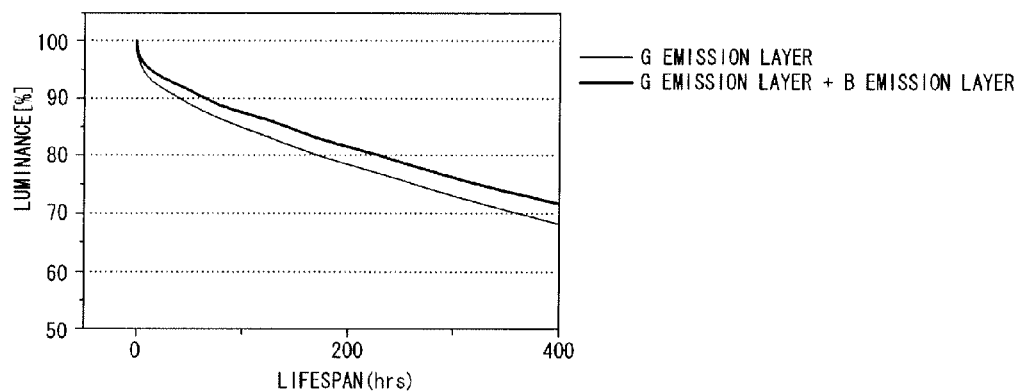

METHOD OF FABRICATING ORGANIC LIGHT EMITTING DIODE DISPLAY

This application claims the priority and the benefit of Korea Patent Application No. 10-2009-107018 filed on Nov. 6, 2009, the entire contents of which is incorporated herein by reference for all purposes as if fully set forth herein.

BACKGROUND

1. Field of the Invention

This document relates to a method of fabricating organic light emitting diode display.

2. Related Art

In recent years, various kinds of flat panel display devices ("FPDs") have been developed which are capable of reducing weight and volume which are disadvantageous in a cathode ray tube. Such FPDs include, for example, liquid crystal displays ("LCDs"), field emission displays ("FEDs"), plasma display panels ("PDPs"), electroluminescence displays (ELDs) and so on.

The PDPs are the most advantageous displays in implementing a slim, light-weight and large-sized screen since its structure and fabrication process are simple, but are disadvantageous in that they have low luminous efficiency and luminance, and large power consumption. The TFT LCDs (thin film transistor LCDs) have been most widely used but are disadvantageous in that they have a small viewing angle and a low response speed. The ELDs are largely classified into an inorganic light emitting diode display and an organic light emitting diode display according to materials used in an emission layer. Of the two, the organic light emitting diode display is a self-emitting element and is advantageous in that it has high response speed, luminous efficiency, and luminance, and a large viewing angle.

The organic light emitting diode display comprises an organic light emitting diode ("OLED") as shown in FIG. 1.

The OLED, which is an organic electron element converting an electric energy into a light energy, has a structure where organic emission materials for emitting light are placed between an anode electrode ANODE and a cathode electrode CATHODE. Holes are injected from the anode electrode and electrons are injected from the cathode electrode. The holes and electrons are injected from the electrodes to an organic emission layer EML which emits light to thereby form excitons, and the OLED emits light due to energy generated when the excitons returns to a bottom level. In order to smoothly inject the holes and electrons into the emission layer EML from the electrodes, typically, a hole transport layer HTL and a hole injection layer HIL are placed between the emission layer EML and the anode electrode, and an electron transport layer ETL and an electron injection layer EIL are placed between the emission layer EML and the cathode electrode. For the smooth hole injection, the hole injection layer HIL and the hole transport layer HTL have an HOMO (highest occupied molecular orbital) level which corresponds to the middle level between the emission layer EML and the anode electrode. In addition, for the smooth electron injection, the electron transport layer ETL and the electron injection layer EIL have a LUMO (lowest unoccupied molecular orbital) level which corresponds to the middle level between the cathode electrode and the emission layer EML. Brightness and efficiency characteristics of the OLED element are determined by the amount of the holes and electrons injected from the anode electrode and cathode electrode. The amount of the holes injected from the anode electrode to the emission layer EML and the amount of the electrons injected from the cathode to the emission layer EML are varied depending on an energy level of the organic emission material.

Meanwhile, in the OLED display, for implementation of full colors, the emission layer EML is formed at a position where the OLED is disposed in each of red, green, and blue pixels. The emission layer EML is patterned for each pixel. As methods of forming the emission layer EML, there have been known a method of using a fine metal mask (FMM), an ink jet method, a laser induced thermal imaging (LITI), or the like.

In the FMM method, red, green, and blue emission materials are patterned for each pixel using a metal fine mask to form red, green, and blue pixels. This method has superiority in terms of element characteristics; however, it has a low yield due to the phenomenon of the mask blocking, and is hardly applied to a large-sized display device since a large-sized mask is difficult to develop.

The ink jet method is advantageous since the emission layer can be formed at selected regions and there is no damage to materials, thereby implementing large-sized screen and high definition, and enabling emission materials to have high luminous efficiency. However, in the ink jet method, there is need of accurate adjustment of an amount, a speed, a uniform jetting angle and so on of ink jetted from nozzles, and also, for implementing low cost and large-sized screen, there is need of development of ink jet heads for high speed jetting and increase of the number of heads. Further, quality and thickness of a thin film are required to be uniform so as to secure good emission inside pixel; however, there appears a so-called coffee stain effect where a periphery of the thin film becomes thicker in the course of drying ink drops, and thus the periphery is thickened.

The laser induced thermal imaging is a method in which a light source like a laser is irradiated to a transfer substrate formed of an organic emission material pattern, a light-to-heat conversion layer, and a support film, and the organic emission material pattern on the transfer film is transferred onto a substrate, thereby forming an emission layer. Describing this further in detail, in the laser induced thermal imaging, the transfer film provided with red, green, and blue organic emission material patterns is disposed on the substrate provided with black matrices, and thereafter the substrate and the transfer film are aligned and attached to each other. Next, the substrate to which the transfer film is attached is positioned on a stage of a laser irradiation device, and then the stage or a laser head moves from one end of the substrate to the other end thereof to perform a laser scanning. Thereby, a laser beam is sequentially irradiated to the red, green, and blue organic emission material patterns. Accordingly, the organic emission material patterns are sequentially transferred to the respective pixel regions on the substrate.

In the case where the organic emission layers are formed on the substrate by the use of the laser induced thermal imaging in this way, a series of processes are repeated to form the red, green, and blue organic emission layers, that is, the respective transfer films corresponding to the red, green, and blue are attached to the substrate, the laser is irradiated thereto in the scanning manner, and then the transfer films are detached. Thus, the repeated fabrication processes cause process time to be lengthened and the processes to be complicated. Further, there are problems in that bad patterns are sometimes generated due to micro bubbles in the course of attaching and detaching the respective transfer films of red, green, and blue, and the edges of the organic emission layers become rough by the repeated irradiation of the laser beam, and the attachment and detachment of the transfer films.

SUMMARY

Embodiments of this document provides a method of fabricating an organic light emitting diode display capable of implementing large-sized screen and high resolution with a low cost and capable of fabricating organic emission layers with a relatively simple process.

According to an exemplary embodiment of this document, there is provided a method of fabricating an organic light emitting diode (OLED) display provided with a plurality of pixels where OLEDs are formed respectively, the method comprising sequentially forming a thin film transistor (TFT) array, first electrodes, and a first related layer on a first substrate, respectively forming heat-generating elements at positions on a second substrate, corresponding to red pixels on the first substrate, and at positions on a third substrate, corresponding to green pixels on the first substrate, forming a red organic emission pattern on the second substrate provided with the heat-generating elements, and forming a green organic emission pattern on the third substrate provided with the heat-generating elements, aligning and attaching the first and second substrates, and thereafter applying a voltage to the heat-generating elements on the second substrate to transfer the red organic emission pattern to red pixel regions on the first substrate, thereby forming red organic emission layers at one time, aligning and attaching the first and third substrates, and thereafter applying a voltage to the heat-generating elements on the third substrate to transfer the green organic emission pattern to green pixel regions on the first substrate, thereby forming green organic emission layers at one time, entirely depositing a blue organic emission material on the first substrate provided with the red organic emission layers and the green organic emission layers, thereby forming a blue organic emission layer, and sequentially forming a second related layer and a second electrode on the first substrate provided with the blue organic emission layer.

An HOMO level for the blue organic emission layer formed by the method may be smaller than an HOMO level for the red and green organic emission layers by about 0.1 eV to about 0.5 eV, and a LOMO level for the blue organic emission layer may be equal to or greater than a LOMO level for the red and green organic emission layers.

In addition, the first and second electrodes may be an anode electrode and a cathode electrode, respectively, the first related layer may be a hole related layer which functions to inject and transport holes, and the second related layer may be an electron related layer which functions to inject and transport electrons. Alternatively, the first and second electrodes may be a cathode electrode and an anode electrode, respectively, the first related layer may be an electron related layer which functions to inject and transport electrons, and the second related layer may be a hole related layer which functions to inject and transport holes.

The method may further comprises forming bank patterns isolating the first electrodes from each other after forming the TFT array and the first electrodes on the first substrate before forming the first related layer.

In addition, a width of the emission element may be equal to or smaller than a width obtained by summing a width of each of the pixels and a width of the bank pattern.

The emission material may be made of any one, two or more or alloy thereof selected from the group consisting of Ag, Au, Al, Cu, Mo, Pt, Ti, W, and Ta.

Also, the method may further comprises forming an insulating layer on the heat-generating elements before forming the red and green organic emission patterns on the heat-generating elements on the second and third substrates.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 7A to 7C are equivalent circuit diagrams of pixels;

FIG. 8 is a table illustrating luminous efficiencies of the organic emission layers in a case where only the green organic emission layer is formed and in a case where the green organic emission layer and the blue organic emission layer are formed to overlap each other; and FIG. 9 is a graph illustrating lifespan of the organic emission layers in the case where only the green organic emission layer is formed and in the case where the green organic emission layer and the blue organic emission layer are formed to overlap each other.

DETAILED DESCRIPTION

Figure 1:
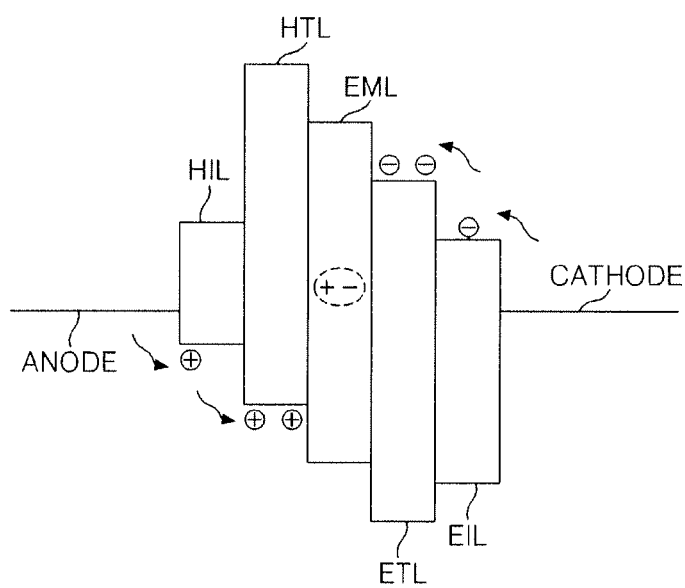
FIG. 1 is a diagram illustrating a structure of an OLED.

Exemplary embodiments of this document will now be described with reference to FIGS. 2 to 9. Like reference numerals designate like elements throughout the specification.

Figure 2:
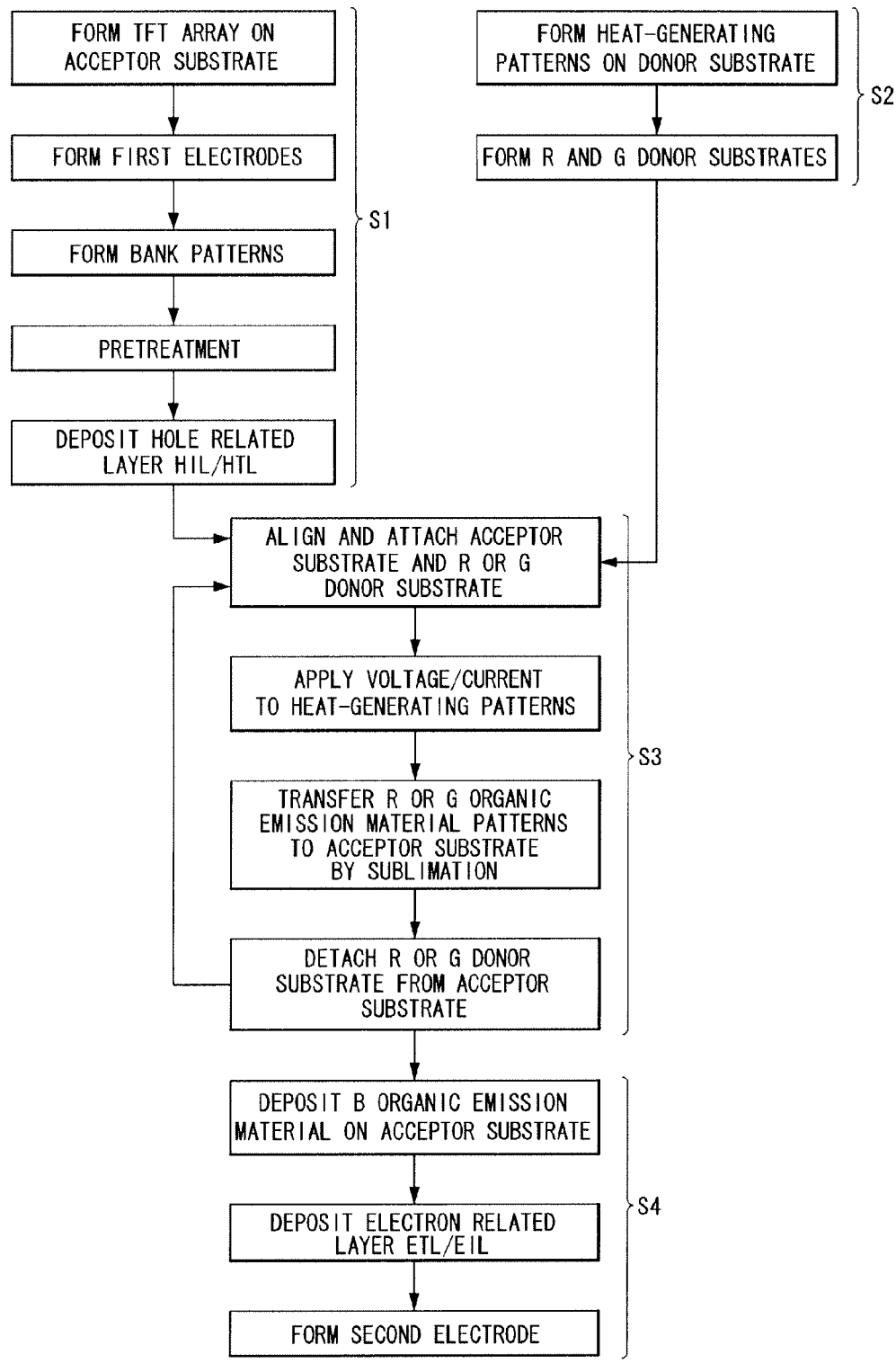
FIG. 2 is a flowchart illustrating a method of fabricating an OLED display according to an embodiment of this document.
Figure 6A:
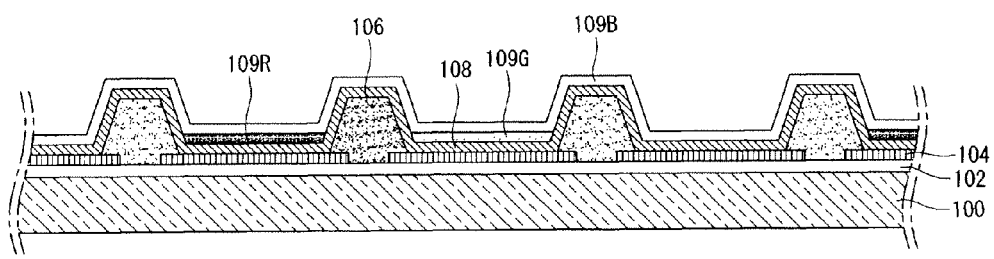
FIGS. 6A to 6C are sectional views illustrating procedures of forming an electron related layer and second electrodes of the OLED.
Figure 6B:
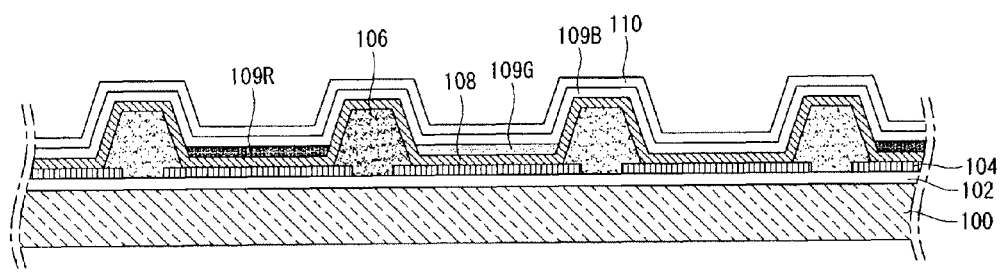
Figure 6C:
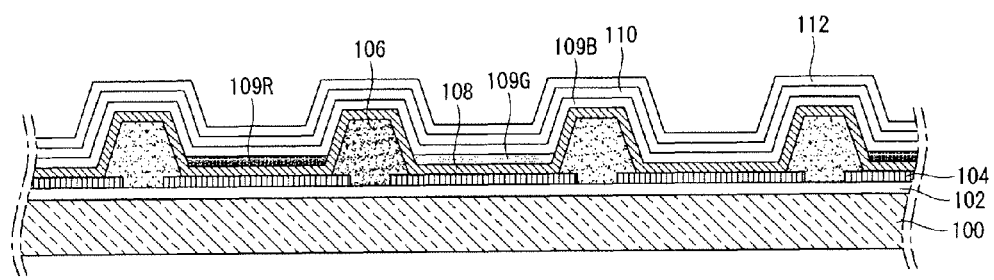
Figure 7A:
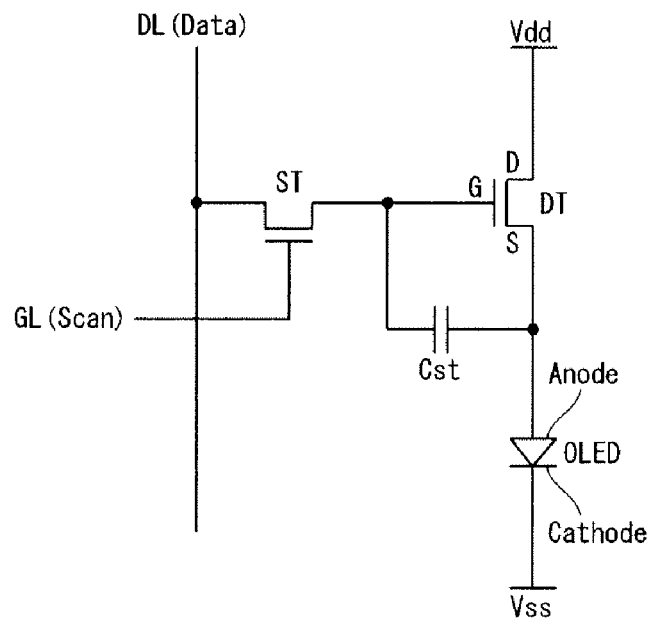
Figure 7B:
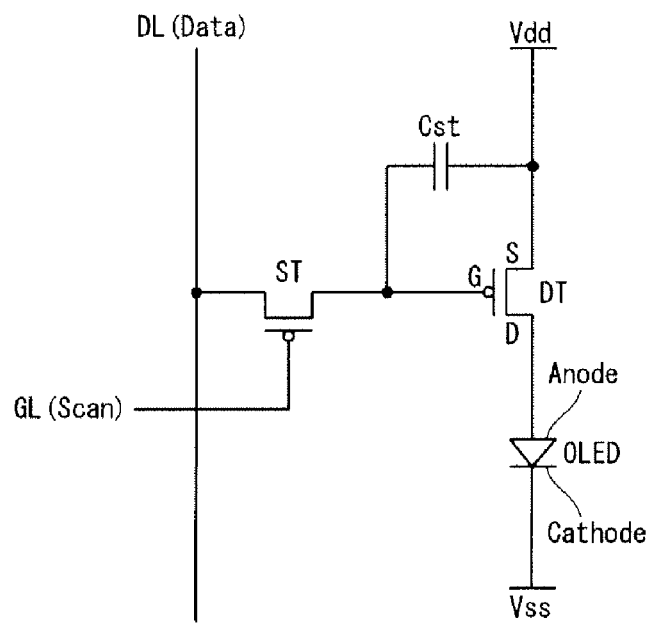

FIG. 2 is a schematic flowchart illustrating a method of fabricating an OLED display according to an embodiment of this document, and FIGS. 3A to 3D are sectional views illustrating procedures of forming a TFT array, first electrodes of the OLED, bank patterns, and a hole related layer on an acceptor substrate. FIGS. 4A to 4C are sectional views illustrating procedures of forming heat-generating patterns (for example, metal patterns), and red R and green G organic emission material patterns on a donor substrate. FIGS. 5A to 5D are sectional views illustrating procedures of forming red and green emission layers by the attachment and transfer of the acceptor substrate and the donor substrate. FIGS. 6A to 6C are sectional views illustrating procedures of forming an electron related layer and a second electrode of the OLED, and FIGS. 7A to 7C are equivalent circuit diagrams of pixels. FIG. 8 is a table illustrating luminous efficiencies of the organic emission layers in a case where only the green organic emission layer is formed and in a case where the green organic emission layer and the blue organic emission layer are formed to overlap each other, and FIG. 9 is a graph illustrating lifespan of the organic emission layers in the case where only the green organic emission layer is formed and in the case where the green organic emission layer and the blue organic emission layer are formed to overlap each other.

Referring to FIG. 2, a method of fabricating an OLED display according to an embodiment of this document comprises processes S1 of forming an acceptor substrate, processes S2 of forming red and green donor substrates, processes S3 of attaching the acceptor substrate and the red donor substrate or the green donor substrate to each other and then transferring a red R emission material pattern and a green G emission material pattern to the acceptor substrate, and processes S4 of depositing a blue B organic emission material on the acceptor substrate and forming an electron related layer and a second electrode.

In the processes S1 of forming the acceptor substrate, the TFT array, the first electrodes of the OLED, the bank patterns, and the hole related layers HIL and HTL are formed. In the processes S2 of forming the donor substrate, two substrates are prepared, the heat-generating patterns are formed on the respective substrates, the red R and green G organic emission material patterns are formed on the entire surfaces of the respective substrates provided with the heat-generating patterns, and the red donor substrate and the green donor substrate are formed. In the attachment and transfer processes S3, the acceptor substrate and the donor substrate are aligned and attached to each other, joule heat is generated by applying voltage/current to the heat-generating patterns on the red donor substrate, and thus the red organic emission material patterns formed on the red donor substrate sublimate to be transferred to the acceptor substrate. By the same process, after aligning and attaching the acceptor substrate and the green donor substrate to each other, the green emission material patterns are formed on the acceptor substrate by transferring the green organic emission material patterns formed on the green donor substrate to the acceptor substrate. Further, in the processes S4, the blue B organic emission material is entirely deposited on the hole related layer on the acceptor substrate to form the blue organic emission layers overlapping the red and green organic emission layers, and the electron related layers ETL and EIL and the second electrode are sequentially formed on the blue organic emission layer.

To begin with, the processes S1 of forming the acceptor substrate will be described further in detail with reference to FIGS. 3A to 3D.

Figure 3A:
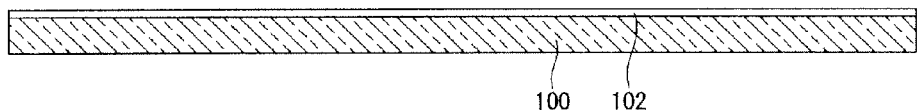
FIGS. 3A to 3D are sectional views illustrating procedures of forming a TFT array, first electrodes of the OLED, bank patterns, and a hole related layer on an acceptor substrate.
Figure 4A:
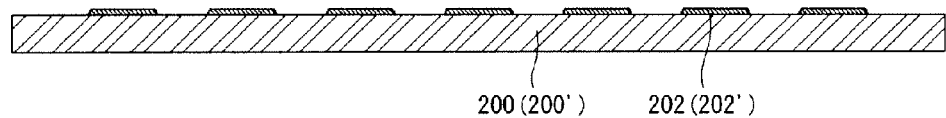
FIGS. 4A to 4C are sectional views illustrating procedures of forming heat-generating patterns and organic emission material patterns on a donor substrate.
Figure 4B:
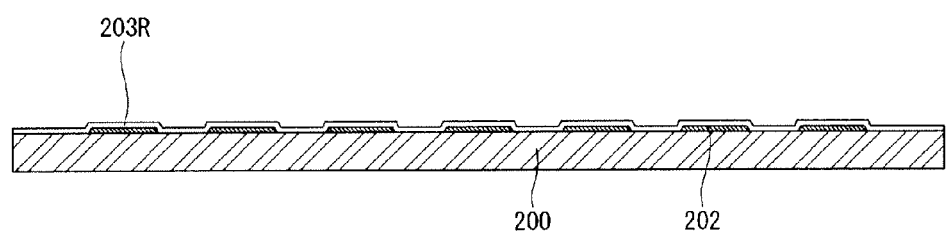
Figure 4C:
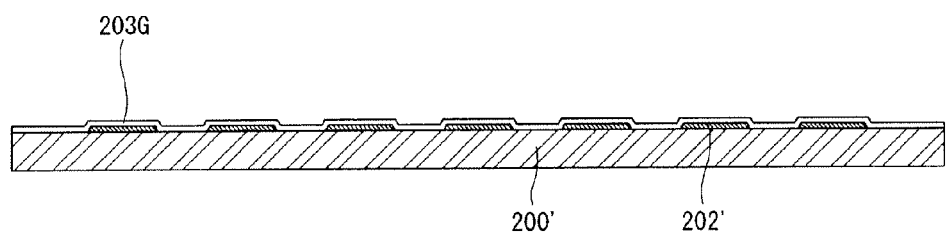

Referring to FIG. 3A, a TFT array 102 is formed on an acceptor substrate 100 made of transparent glass or plastic. The TFT array 102 comprises, as shown in FIGS. 7A to 7C, a gate line GL, a data line DL, a switching TFT ST, a driving TFT DT, a storage capacitor Cst, a voltage supply line Vdd, a ground voltage supply line Vss, and so on. Further, the TFTs ST and DT may be implemented by N type MOSFETs, but is not limited thereto. For example the TFTs may be implemented by P type MOSFETs as shown in FIG. 7B. The equivalent circuits of pixels shown in FIGS. 7A to 7C are formed by two transistors and one capacitor as an example, but the TFT array structure of this document is not limited thereto. The TFT array 102 may comprises a passivation layer for protecting the TFT array from the external environment, an overcoat layer for removing a step difference caused by the TFTs ST and DT, a buffer layer for shielding the out-gasing from the overcoat layer, and so on, but, for simplicity of the description, they are omitted in the figures.

Figure 3B:
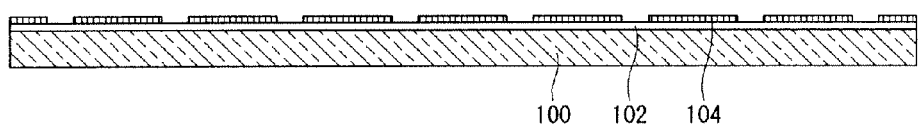

Referring to FIG. 3B, first electrodes 104 of the OLED are formed on the acceptor substrate 100 provided with the TFT array 102. Each of the first electrodes 104 is connected to one electrode of the driving TFT DT through the buffer layer, the overcoat layer and the passivation layer (not shown). The first electrodes 104 may be anode electrodes having reflective layers, or cathode electrodes depending on a connection structure with the driving TFT DT. For example, in FIG. 7A, the first electrode 104 is an anode electrode connected to a source electrode S of the driving TFT DT, and, in FIG. 7B, the first electrode 104 is an anode electrode connected to a drain electrode D of the driving TFT DT. In addition, in FIG. 7C, the first electrode 104 is a cathode electrode connected to the drain electrode D of the driving TFT DT. Hereinafter, the first electrode 104 is assumed to be the anode electrode having a reflective layer. The first electrode 104 is a transparent conductor formed of an oxide such as ITO or IZO and is patterned by pixel unit on the reflective layer containing opaque metal materials. The first electrode 104 applies holes, which are supplied via the driving TFT DT, to organic compound layers via the hole related layers HIL and HTL described later.

Figure 3C:
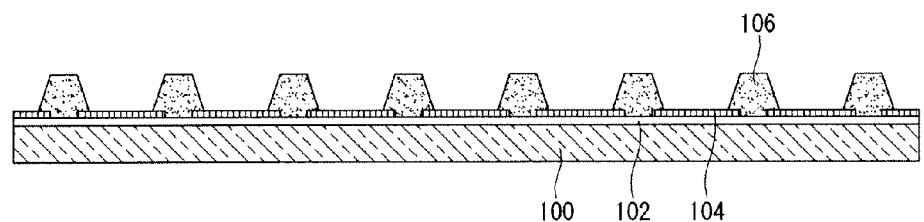

Referring to FIG. 3C, bank patterns 106 are formed on the acceptor substrate 100 provided with the anode electrodes 104. The bank patterns 106 are formed at boundary regions between pixels to partition opening regions of the pixels. After the bank patterns 106 are formed on the acceptor substrate 100, a pretreatment process is performed using plasma. The pretreatment process removes alien materials remaining on the acceptor substrate 100 before depositing the organic compound layers of the OLED.

Figure 3D:
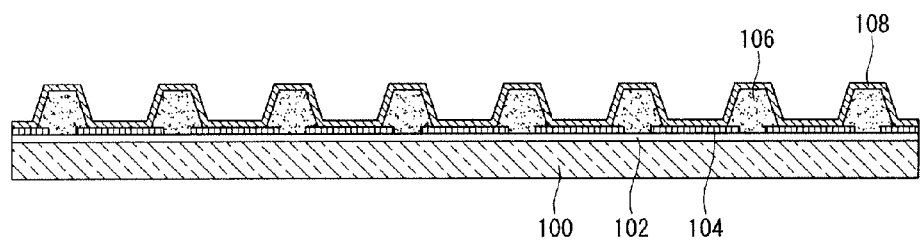

Referring to FIG. 3D, a hole injection layer HIL material and a hole transport layer HTL material are consecutively entirely deposited on the acceptor substrate 100 provided with the bank patterns 106, by the thermal evaporation, thereby forming a hole related layer 108.

Next, the processes S2 of forming the donor substrate will be described further in detail with reference to FIGS. 4A to 4C.

Referring to FIG. 4A, heat-generating patterns 202 and 202' are respectively formed on two donor substrates 200 and 200' made of transparent glass or plastic. Sizes of the donor substrates 200 and 200' may be equal to or greater than a size of the acceptor substrate 100. The heat-generating patterns 202 and 202' may be made of any one, two or more or alloy thereof selected from the group consisting of Ag, Au, Al, Cu, Mo, Pt, Ti, W, and Ta, which can generate heat by application of voltage, but not limited thereto. The heat-generating patterns 202 and 202' may be formed using any methods such as the CVD (chemical vapor deposition), the sputtering, the E-beam, electrolysis/electroless plating, or the like. The heat-generating patterns 202 and 202' are formed by entirely depositing the metal or the alloy thereof and by patterning the entirely deposited metal or alloy thereof through a photolithography process and a wet etching or a dry etching. The heat-generating patterns 202 and 202' are formed in accordance with pixel positions on the acceptor substrate 100 in which organic emission material patterns will be transferred. A width of each of the heat-generating patterns 202 and 202' formed on the donor substrates 200 and 200' may be equal to or smaller than a value obtained by summing a width of each pixel on the acceptor substrate 100 and a width of the bank pattern 106 which partitions adjacent pixels. A thickness of each of the heat-generating patterns 202 and 202' may be maximally 1 μm in consideration of a resistance component which generates joule heat.

Referring to FIG. 4B, a red R organic emission material is entirely deposited, by the thermal evaporation or the like, on the donor substrate 200 where the heat-generating patterns 202 are formed, and thereafter a red emission material pattern 203R is formed on the heat-generating patterns 202 corresponding to positions where red pixels will be formed on the acceptor substrate 100, thereby forming the red donor substrate.

Referring to FIG. 4C, a green G organic emission material is entirely deposited, by the thermal evaporation or the like, on the donor substrate 200' where the heat-generating patterns 202' are formed, and thereafter a green emission material pattern 203G is formed on the heat-generating patterns 202' corresponding to positions where green pixels will be formed on the acceptor substrate 100, thereby forming the green donor substrate.

In order to prevent the heat-generating patterns 202 and 202' generating joule heat from being oxidized or diffused to the organic emission material patterns 203R and 203G, insulating layers may be further formed between the heat-generating patterns 202 or 202' and the organic emission material patterns 203R or 203G. The insulating layers may be formed of a silicon oxide, a silicon nitride, or a silicon oxinitride, and entirely deposited on the heat-generating patterns 202 and 202'. Further, the insulating layers may employ a material used in the SOG (spin-on-glass) and may be entirely deposited on the heat-generating patterns 202 and 202' through the heat treatment after spin coating.

Subsequently, the attachment and transfer processes S3 will be described further in detail with reference to FIGS. 5A to 5D.

Figure 5A:
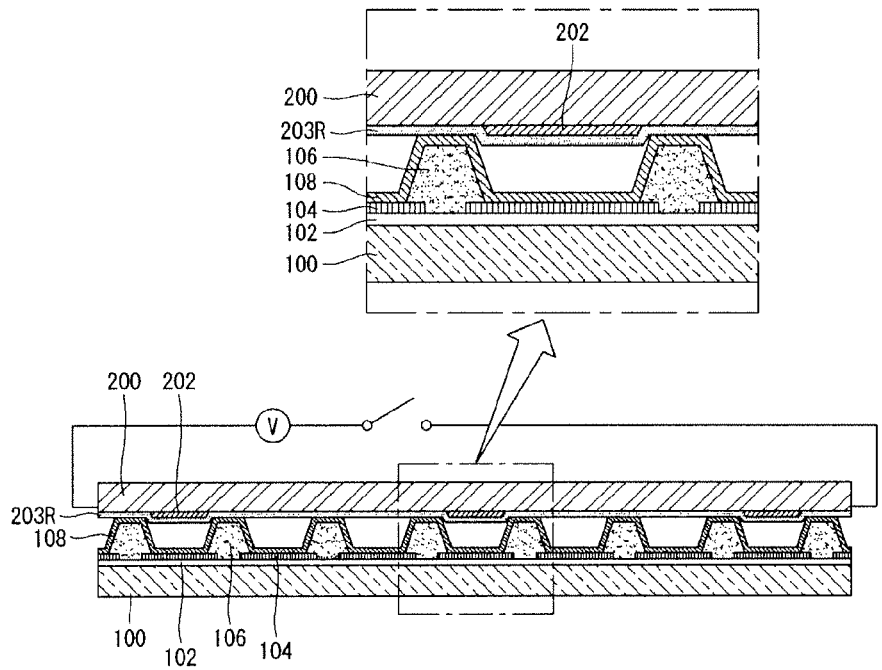
FIGS. 5A to 5D are sectional views illustrating procedures of forming emission layers by the attachment and transfer.

Referring to FIG. 5A, the acceptor substrate 100 provided with the hole related layer 108 and the red donor substrate 200 provided with the red organic emission material pattern are aligned and attached to each other. These alignment and attachment are performed under a vacuum or inert gas (Ar, N$_2$, etc.) atmosphere so as to protect the organic material pattern from moisture and/or oxygen. The attachment may be performed by a mechanical pressing.

Figure 5B:
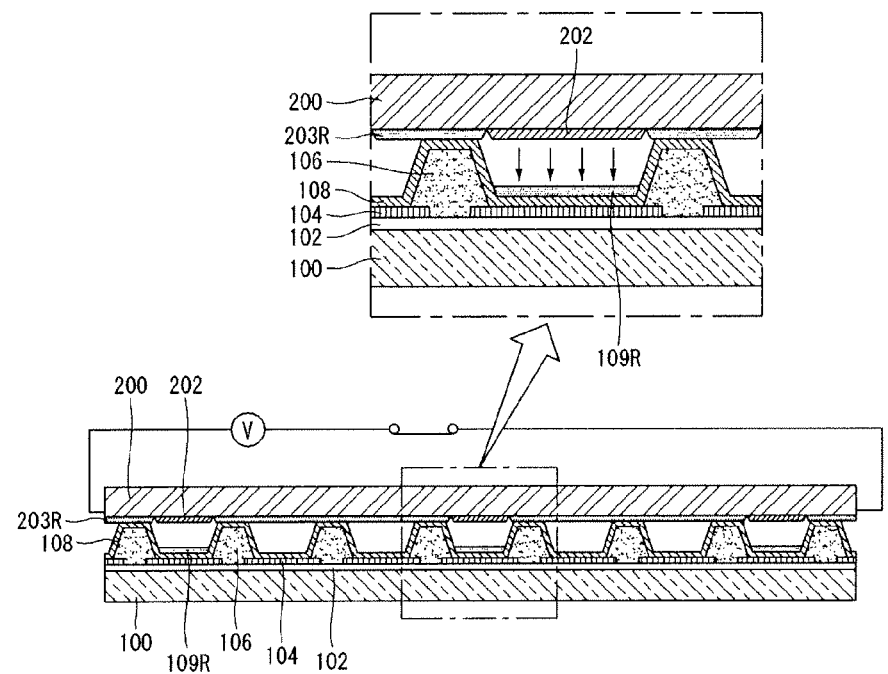

Referring to FIG. 5B, an external voltage V is applied to the heat-generating patterns 202 on the red donor substrate 200 where the alignment and the attachment are completed. By the application of the voltage V, the heat-generating patterns 202 generate joule heat and in turn the red emission material pattern 203R sublimates. As a result, the red organic emission material pattern 203R is transferred onto the red pixel regions on the acceptor substrate 100 to form the red organic emission layers 109R.

Figure 5C:
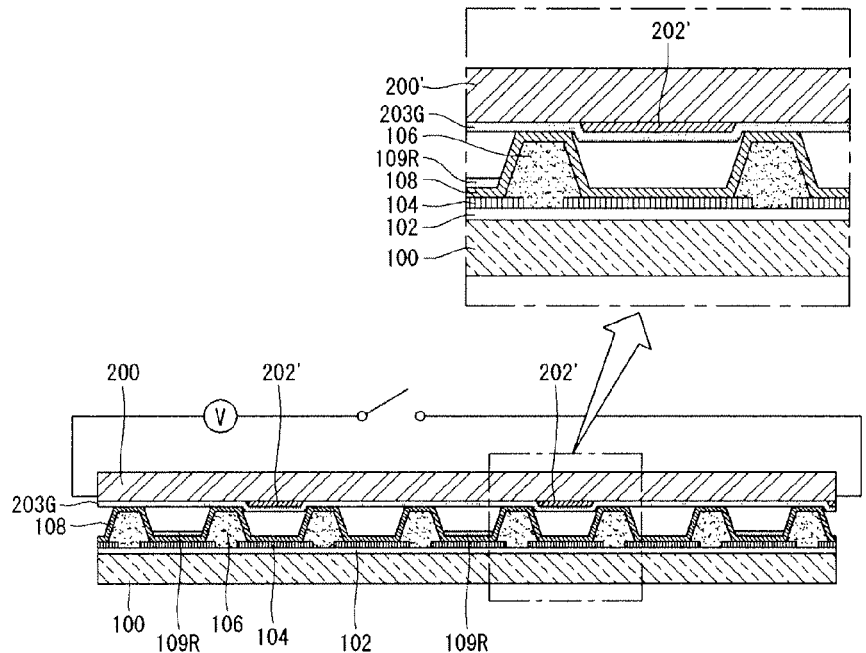

Referring to FIG. 5C, the acceptor substrate 100 provided with the hole related layer 108 and the red organic emission layers 109R is aligned and attached with the green donor substrate 200' provided with the green organic emission material pattern 109G each other. These alignment and attachment are performed under a vacuum or inert gas (Ar, N2, etc.) atmosphere so as to protect the organic material pattern from moisture and/or oxygen. The attachment may be performed by a mechanical pressing.

Figure 5D:
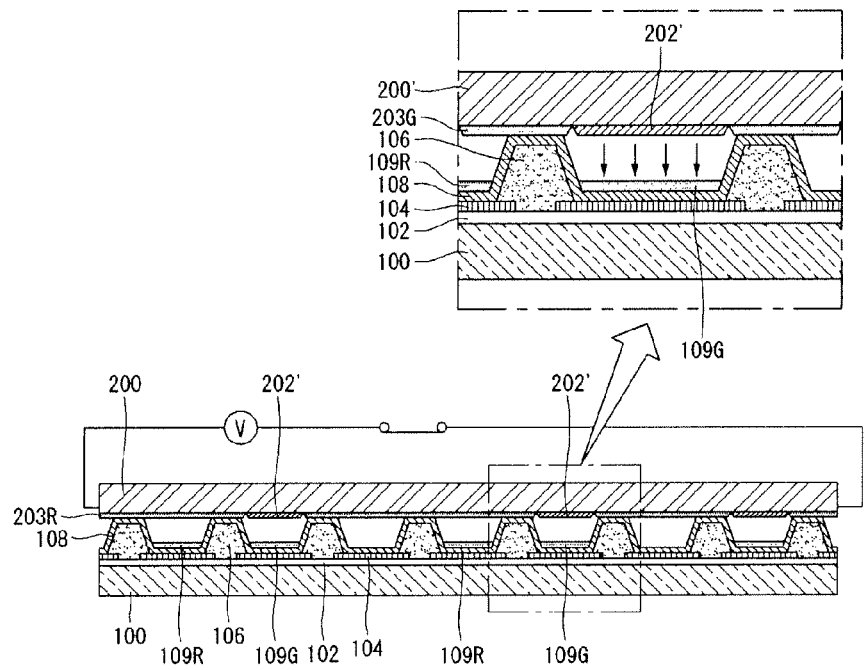

Referring to FIG. 5D, the external voltage V is applied to the heat-generating pattern 202' on the green donor substrate 200' where the alignment and the attachment are completed. By the application of the voltage V, the heat-generating patterns 202' generate joule heat and in turn the green organic emission material pattern 203G sublimates. As a result, the green emission material pattern 203G is transferred onto the green pixel regions on the acceptor substrate 100 to form the green organic emission layers 109G. In this embodiment, although the case where the red organic emission layers are formed earlier and the green organic emission layers are formed later has been described, this document is not limited thereto, and it is also possible to form the green organic emission layers earlier and to form the red organic emission layers later.

Since the acceptor substrate 100 and the donor substrate 200 and 200' are close to each other with the bank patterns 106 therebetween, it is possible not only to prevent a color mixing phenomenon caused by the transfer being deviated to other pixel regions or being spread, but also to accurately control positions where the organic emission layers are formed. Also, since one process by the application of voltage enables the red organic emission layers 109R and the organic emission layers 109G to be formed respectively at the same time, there is an advantage in that it is possible to save time which is wasted by the sequential scanning like the laser induced thermal imaging, and thereby the fabrication process is simple and the fabrication time is considerably shortened.

When these organic emission materials are exposed to high temperature for a long time, the materials typically are denatured or their chemical bonds are destroyed. Therefore, in order to prevent the thermal denaturalization of the organic emission materials, an application time of the voltage applied to the heat-generating patterns 202 may be in a range of about 0.1 µs to about 1 s, and a power density of the voltage applied to the heat-generating patterns 202 may be in a range of about 0.1 W/cm$^2$ to about 10000 W/cm$^2$. The voltage applied to the heat-generating patterns 202 may be of a direct current type or an alternating current type, and may be applied several times intermittently.

The processes S4 of forming the blue organic emission layer, the electron related layer ETL/EIL, and the second electrode on the acceptor substrate will be described further in detail with reference to FIGS. 6A to 6C.

Referring to FIG. 6A, a blue organic emission layer 109B is entirely deposited on the acceptor substrate 100 provided with the red organic emission layers 109R and the green organic emission layers 109G. By the entire deposition of the blue organic emission layer 109B, the blue organic emission layer 109B is formed to overlap the red organic emission layers 109R and the green organic emission layers 109G at the red and green pixel regions, and only the blue organic emission layer 109B is formed at the blue pixel regions. However, when the blue organic emission layer 109B overlaps the red organic emission layers 109R and the green organic emission layers 109G, the blue is emitted even from the red organic emission layers 109R and the green organic emission layers 109G and is mixed with the red and green, so a color intended to be displayed is not displayed accurately. In this embodiment, the HOMO level for the blue organic emission layer 109B is smaller than the HOMO level for the red and green organic emission layers 109R and 109G by about 0.1 eV to about 0.5 eV. As such, when the HOMO level for the blue organic emission layer 109B is smaller than the HOMO level for the red and green organic emission layers 109R and 109G, the injection of holes is limited due to an energy barrier to suppress the emission of the blue, thereby preventing the blue from being mixed with the red and the green. Further, in this embodiment, the LUMO level for the blue organic emission layer 109B is equal to or greater than the LUMO level for the red and green organic emission layers 109R and 109G. As such, when the LUMO level for the blue organic emission layer 109B is equal to or greater than the LUMO level for the red and green organic emission layers 109R and 109G, the luminous efficiency can be improved since electrons are easily injected to the red organic emission layers 109R and the green organic emission layers 109G from the blue organic emission layer 109B.

Referring to FIG. 6B, an electron transport layer ETL material and an electron injection layer EIL material are consecutively entirely deposited on the acceptor substrate 100 provided with the blue organic emission layer 109B by the thermal evaporation, thereby forming an electron related layer 110. The hole related layer 108, the red, green and blue organic emission layers 109R, 109G and 109B constitute the organic compound layers of the OLED.

Referring to FIG. 6C, a second electrode 112 of the OLED is formed on the entire surface of the acceptor substrate 100 provided with the electron related layer 110. The second electrode 112, which is a cathode electrode, may be a single layer made of a metal material, or may be formed of multi-layers comprising first and second metal layers which are disposed between dielectric layers. The second electrode 112 applies electrons supplied via the voltage supply line Vss to the organic compound layers.

FIGS. 8 and 9 are a table and a graph illustrating increases in luminous efficiencies and lifespan of the OLED according to an embodiment of this document.

FIG. 8 is a table illustrating luminous efficiencies of the organic emission layers in a case where only the green organic emission layer is formed and in a case where the green organic emission layer and the blue organic emission layer are formed to overlap each other. As can be seen from FIG. 8, the case where only the green organic emission layer is formed shows the brightness efficiency of 25.99 Cd/Ampere and the luminous efficiency of 2599 Cd/m$^2$ at the voltage 3.20V, but the case where the green organic emission layer and the blue organic emission layer according to this embodiment are formed to overlap each other shows the brightness efficiency of 29.52 Cd/A and the luminous efficiency of 2951 Cd/m2 at the voltage 4.23V, which thus achieves an improvement effect of about 8.8% in the brightness efficiency and the luminous efficiency.

FIG. 9 is a graph illustrating relative luminance of the organic emission layers in the case where only the green organic emission layer is formed and in the case where the green organic emission layer and the blue organic emission layer are formed to overlap each other. In FIG. 9, the transverse axis represents operation time of the OLED, and the longitudinal axis represents the luminance (%) of the organic emission layers. The luminance value (%) gradually decreases starting from 100% as time goes by, in the graph. As can be seen from FIG. 9, the case where the green organic emission layer and the blue organic emission layer are formed to overlap each other according to this embodiment shows, during the same operation time, the luminance value higher than the case where only the green organic emission layer is formed, and thus the organic emission layers in this embodiment achieves the effect that the lifespan is lengthened.

As described above, according to the method of fabricating the OLED display in this embodiment, since the red organic emission layers and the green organic emission layers are formed by the method using the joule heat, one process by the application of voltage enables the red organic emission layers and the green organic emission layers to be formed respectively at the same time. Therefore, there is an advantage in that it is possible to save time which is wasted by the sequential scanning like the laser induced thermal imaging, and thereby the fabrication process is simple and the fabrication time is considerably shortened.

In addition, since the blue organic emission layer is formed by the deposition, the blue organic emission layer weak to heat is not directly influence by heat in the course of forming the blue organic emission layer, and thereby the lifespan of the blue organic emission layer can be considerably lengthened.

Also, for the color mixing generated when the blue organic emission layer overlaps the red and green organic emission layers, the HOMO level for the blue organic emission layer is smaller than the HOMO level for the red and green organic emission layers by about 0.1 eV to about 0.5 eV to form an energy barrier between the blue organic emission layer and the red or green organic emission layer. Accordingly, it is possible to display accurate color because the energy barrier suppresses the emission of the blue at regions where the blue organic emission layer is overlapped with the red or green organic emission layer.

One skilled in the art will readily recognize from such discussion, the accompanying drawings and the claims that various modifications can be made without departing from the spirit and scope of the invention. For example, although the case where the first and second electrodes are an anode electrode and a cathode electrode, respectively, has been described in the embodiment of this document, this document is applicable to a case where the first and second electrodes are a cathode electrode and an anode electrode, respectively. In this case, the hole related layer described in the embodiment may be replaced with an electron related layer, and the electron related layer described in the embodiment may be replaced with a hole related layer. Therefore, the scope of the invention is indicated by the appended claims rather than the foregoing description, and all changes that come within the meaning and range and equivalence thereof are intended to be embraced therein.

What is claimed is:

1. A method of fabricating an organic light emitting diode (OLED) display provided with a plurality of pixels where OLEDs are formed respectively, the method comprising:
   sequentially forming a thin film transistor (TFT) array, first electrodes, and a first related layer on a first substrate;
   respectively forming heat-generating elements at positions on a second substrate, corresponding to red pixels on the first substrate, and at positions on a third substrate, corresponding to green pixels on the first substrate;
   forming a red organic emission pattern on the second substrate provided with heat-generating elements, and forming a green organic emission pattern on the third substrate provided with the heat-generating elements;
   aligning and attaching the first and second substrates, and thereafter applying a voltage to the heat-generating elements on the second substrate to transfer the red organic emission pattern to red pixel regions on the first substrate, thereby forming red organic emission layers at one time;
   aligning and attaching the first and third substrates, and thereafter applying a voltage to the heat-generating elements on the third substrate to transfer the green organic emission pattern to green pixel regions on the first substrate, thereby forming green organic emission layers at one time;
   entirely depositing a blue organic emission material on the first substrate provided with the red organic emission layers and the green organic emission layers, thereby forming a blue organic emission layer; and
   sequentially forming a second related layer and a second electrode on the first substrate provided with the blue organic emission layer.

2. The method of claim 1, wherein an HOMO level for the blue organic emission layer is smaller than an HOMO level for the red and green organic emission layers by about 0.1 eV to about 0.5 eV.

3. The method of claim 2, wherein a LOMO level for the blue organic emission layer is equal to or greater than a LOMO level for the red and green organic emission layers.

4. The method of claim 1, wherein the first and second electrodes are an anode electrode and a cathode electrode, respectively, the first related layer comprises a hole related layer which functions to inject and transport holes, and the second related layer comprises an electron related layer which functions to inject and transport electrons.

5. The method of claim 1, wherein the first and second electrodes are a cathode electrode and an anode electrode, respectively, the first related layer comprises an electron related layer which functions to inject and transport electrons, and the second related layer comprises a hole related layer which functions to inject and transport holes.

6. The method of claim 1, further comprising forming bank patterns isolating the first electrodes from each other after forming the TFT array and the first electrodes on the first substrate before forming the first related layer.

7. The method of claim 1, wherein a width of the emission element is equal to or smaller than a width obtained by summing a width of each of the pixels and a width of the bank pattern.

8. The method of claim 1, wherein the heat-generating material comprises any one, two or more, or alloy thereof selected from the group consisting of Ag, Au, Al, Cu, Mo, Pt, Ti, W, and Ta.

9. The method of claim 1, further comprising forming an insulating layer on the heat-generating elements before forming the red and green organic emission patterns on the heat-generating elements on the second and third substrates.

* * * * *